United States Patent
Zhu et al.

(10) Patent No.: US 6,876,687 B2
(45) Date of Patent: Apr. 5, 2005

(54) CURRENT CONFINEMENT STRUCTURE FOR VERTICAL CAVITY SURFACE EMITTING LASER

(75) Inventors: Zuhua Zhu, San Jose, CA (US); Shih-Yuan Wang, Palo Alto, CA (US)

(73) Assignee: Gazillion Bits, Inc., San Jose, CA (US)

( * ) Notice: Subject to any disclaimer, the term of this patent is extended or adjusted under 35 U.S.C. 154(b) by 0 days.

(21) Appl. No.: 10/602,139

(22) Filed: Jun. 23, 2003

(65) Prior Publication Data

US 2004/0004985 A1 Jan. 8, 2004

Related U.S. Application Data

(62) Division of application No. 10/106,991, filed on Mar. 26, 2002, now Pat. No. 6,589,805.
(60) Provisional application No. 60/278,715, filed on Mar. 26, 2001.

(51) Int. Cl.$^7$ ................................................. H01S 5/00
(52) U.S. Cl. .......................................... 372/45; 372/46
(58) Field of Search .............................. 372/43–46, 96, 372/103, 39

(56) References Cited

U.S. PATENT DOCUMENTS

| | | | |
|---|---|---|---|
| 5,058,120 A | * 10/1991 | Nitta et al. ................... 372/46 |
| 5,256,596 A | 10/1993 | Ackley et al. |
| 5,258,316 A | 11/1993 | Ackley et al. |
| 5,416,044 A | * 5/1995 | Chino et al. |
| 5,557,627 A | 9/1996 | Schneider, Jr. et al. |
| 5,559,053 A | 9/1996 | Choquette et al. |
| 5,594,751 A | * 1/1997 | Scott ............................ 372/46 |
| 5,724,376 A | 3/1998 | Kish, Jr. et al. |
| 5,831,295 A | 11/1998 | Huang et al. |
| 5,837,561 A | 11/1998 | Kish, Jr. et al. |
| 5,985,686 A | 11/1999 | Jayaraman |
| 6,160,830 A | 12/2000 | Kiely et al. |
| 6,169,756 B1 | 1/2001 | Chirovsky et al. |
| 6,306,672 B1 | * 10/2001 | Kim ............................. 438/22 |
| 6,465,811 B1 | * 10/2002 | Peters et al. .................. 257/99 |
| 6,545,335 B1 | * 4/2003 | Chua et al. .................. 257/499 |
| 6,546,029 B2 | * 4/2003 | Sirbu et al. ................... 372/20 |
| 6,577,658 B1 | * 6/2003 | Lee et al. ...................... 372/45 |
| 6,589,805 B2 | * 7/2003 | Zhu et al. ..................... 438/22 |
| 6,621,843 B2 | * 9/2003 | Yoo et al. ..................... 372/45 |

(Continued)

OTHER PUBLICATIONS

Choquette, "The Technology of Selectively Oxidized Vertical Cavity Lasers," at Chapter 2 of Cheng and Dutta, eds., *Vertical–Cavity Surface–Emitting Lasers: Technology and Applications*, vol. 10 of *Optoelectronic Properties of Semiconductors and Superlattices*, Manasreh, ed., Gordon and Breach Science Publishers (2000).

(Continued)

*Primary Examiner*—Mingun Oh Harvey
*Assistant Examiner*—Phillip Nguyen
(74) *Attorney, Agent, or Firm*—Cooper & Dunham LLP

(57) ABSTRACT

A vertical cavity surface emitting laser (VCSEL) structure and fabrication method therefor are described in which a subsurface air, gas, or vacuum current confinement method is used to restrict the area of electrical flow in the active region. Using vertical hollow shafts to access a subsurface current confinement layer, a selective lateral etching process is used to form a plurality of subsurface cavities in the current confinement layer, the lateral etching process continuing until the subsurface cavities laterally merge to form a single subsurface circumferential cavity that surrounds a desired current confinement zone. Because the subsurface circumferential cavity is filled with air, gas, or vacuum, the stresses associated with oxidation-based current confinement methods are avoided. Additionally, because the confinement is achieved by subsurface cavity structures, overall mechanical strength of the current-confining region is maintained.

20 Claims, 8 Drawing Sheets

U.S. PATENT DOCUMENTS

| | | | |
|---|---|---|---|
| 2002/0025589 A1 * | 2/2002 | Hall et al. | 438/22 |
| 2002/0025590 A1 * | 2/2002 | Hall et al. | 438/29 |
| 2002/0075922 A1 * | 6/2002 | Yoo et al. | 372/45 |
| 2002/0101894 A1 * | 8/2002 | Colden et al. | 372/43 |
| 2002/0126725 A1 * | 9/2002 | Tayebati | 372/96 |

OTHER PUBLICATIONS

Chua, C.L. et al., "Planar laterally oxidized vertical–cavity lasers for low–threshold high–density top–surface–emitting arrays," IEEE Photonics Technology Letters, vol. 9, No. 8, pp. 1060–1062 (Aug. 1997).

Deppe, "Optoelectronic Properties of Semiconductors and Superlattices," at Chapter 1 of Cheng and Dutta, eds., *Vertical–Cavity Surface–Emitting Lasers: Technology and Applications, vol. 10 of Optoelectronic Properties of Semiconductors and Superlattices*, Manasreh, ed., Gordon and Breach Science Publishers (2000).

Deppe et al, "Low–threshold vertical cavity surface emitting lasers based on oxide confinement and high contrast distributed Bragg reflectors," IEEE Journal of Selected Topics in Quantum Electronics, vol. 3, No. 3, pp. 893–904 (Jun. 1997).

Dutton, Understanding *Optical Communications* (Prentice Hall 1998), at pp. 159–161.

Jewell et. al., "Vertical cavity surface emitting lasers: design, growth, fabrication, characterization", IEEE Journal of Quantum Electronics, vol. 27, No. 6, pp. 1332–1346 (Jun. 1991).

Nishiyama et. al., "Multi–oxide layer structure for single mode operation in vertical cavity surface emitting lasers," IEEE Photonics Technology Letters, vol. 12, No. 6, pp. 606–608 (Jun. 2000).

Sale, T.E., *Vertical Cavity Surface Emitting Lasers*, Wiley & Sons (1995).

* cited by examiner

CURRENT CONFINEMENT STRUCTURE FOR VERTICAL CAVITY SURFACE EMITTING LASER

CROSS-REFERENCE TO RELATED APPLICATIONS

This application is a divisional of Ser. No. 10/106,991, filed Mar. 26, 2002 now U.S. Pat. No. 6,589,805 which claims the benefit of Provisional Application Ser. No. 60/278,715, filed Mar. 26, 2001, which is incorporated by reference herein.

FIELD

This patent specification relates to semiconductor lasers. More particularly, it relates to vertical cavity surface emitting lasers (VCSELs) in which electric current requires lateral confinement in passing through an active region.

BACKGROUND

Solid-state semiconductor lasers represent desirable light sources for a variety of applications including optical data communications, telecommunications, and other applications. A vertical cavity surface emitting laser (VCSEL) is a solid-state semiconductor laser in which light is emitted from the surface of a monolithic structure of semiconductor layers, in a direction normal to the surface. This is in contrast to the more commonly used edge-emitting laser, in which light is emitted from the edge of the wafer. Whereas edge-emitting lasers rely on facet mirrors formed at the wafer edge by cleaving or dry etching, the operation of VCSELs is enabled through the use of distributed Bragg reflector (DBR) mirrors for longitudinal optical confinement. VCSELs are advantageous over edge-emitting lasers in that (i) they have a lower-divergence, circularly-shaped laser beam, (ii) may be manufactured using standard fabrication processes such as those used in silicon VLSI technology, (iii) may be tested at the wafer level prior to packaging, and (iv) may be fabricated in dense 2-dimensional arrays for lower cost and higher volume.

As in any laser, the overall structure of a VCSEL is that of two end mirrors on each side of an active region, the active region producing the light responsive to an electric current therethrough. However, the active region is a thin semiconductor structure, and the end mirrors are distributed Bragg reflector mirrors ("DBR mirrors") comprising alternating layers of differently-indexed material such that light of only the desired wavelengths is reflected. Further general information on VCSELs may be found in the following references, each of which is incorporated by reference herein: Cheng and Dutta, eds., *Vertical-Cavity Surface-Emitting Lasers: Technology and Applications, Vol. 10 of Optoelectronic Properties of Semiconductors and Superlattices*, Manasreh, ed., Gordon and Breach Science Publishers (2000); Sale, T. E., *Vertical Cavity Surface Emitting Lasers*, Wiley & Sons (1995); and Dutton, *Understanding Optical Communications* (Prentice Hall 1998), at pp. 159–161.

Today, VCSELs are widely used in local area networks and in very short-reach applications such as connections between electronic routers, the back planes of computers, computers to disk farms and computers to sensors, and curb to home, at wavelengths of about 650 nm to 980 nm. For long-distance fiber optic communications applications, e.g. generally requiring transmission distances of greater than 10 km, VCSELS having longer output wavelengths of 1300–1550 nm will be useful. Today, commercially-available VCSELs are directly modulated to frequencies of 2.5 Gb/s, while direct modulation of up to 20 Gb/s has been reached in research laboratories. With increasing demands for bandwidth, it becomes desirable to develop practical and reliable VCSELs with modulation frequencies of greater than 10 Gb/s.

One problem in the practical realization of higher VCSEL modulation frequencies exists in regard to current confinement, which relates generally to the confinement of electrical current passing through the active layer to a small lateral portion of that layer to increase current density. At higher modulation frequencies, it is necessary to increase the photon density in the optical cavity to increase the relaxation oscillation frequency of the laser. The increase in photon density necessitates an increase in the injected current density of the laser which, in turn, increases heating at the active layer. Depending on the laser structure, this increase in heat can cause the laser to have a reduced lifetime.

Proper current confinement of the injected electrons and holes to the active area is important to achieve a highly efficient laser. It is not uncommon for a VCSEL to have a desired "wall plug" efficiency, i.e., the ratio of optical power emitted by the laser over the electrical power applied, in excess of 50%. High wall plug efficiency is necessary for high frequency operation to minimize excess heating. Several methods are in use to achieve proper current confinement, including proton implantation methods, mesa methods, buried regrowth methods, and oxide-based methods. Disadvantages exist with these methods, however. For example, one problem with proton implantation is that it cannot define a small sharp region due to the nature of ion implantation. As another example, in the mesa method, the mesa is non-planar and has difficulty in passivation, resulting in poor reliability. As another example, buried regrowth structures are more complex to manufacture and result in a reduced yield.

Oxide confinement, in which layers adjacent to the active layer are selectively oxidized such that current is confined to a small non-oxidized portion, is generally the most widely used method to manufacture low threshold and efficient VCSELs. See Jewell et. al., "Vertical cavity surface emitting lasers: design, growth, fabrication, characterization", IEEE Journal of Quantum Electronics, vol. 27, no. 6, pp. 1332–1346 (June 1991), which is incorporated by reference herein. Oxide-confined VCSELs have achieved sub-milliampere threshold current and single mode operation. See, e.g., Deppe et al, "Low-threshold vertical cavity surface emitting lasers based on oxide confinement and high contrast distributed Bragg reflectors:" IEEE Journal of Selected Topics in Quantum Electronics, vol. 3, no. 3, pp. 893–904 (June 1997); Nishiyama et. al., "Multi-oxide layer structure for single mode operation in vertical cavity surface emitting lasers," IEEE Photonics Technology Letters, vol. 12, no. 6, pp. 606–8 (June 2000); and Deppe, "Optoelectronic Properties of Semiconductors and Superlattices," at Chapter 1 of Cheng and Dutta, supra, each of these references being hereby incorporated by reference herein.

Oxide confinement methods have some characteristics that may result in reduced lifetime of the laser at high current injection operations, as is needed for high modulation frequencies. For example, according to one oxide confinement method discussed in Choquette, "The Technology of Selectively Oxidized Vertical Cavity Lasers," at Chapter 2 of Cheng and Dutta, supra, which is incorporated by reference herein, the high content of Al in an AlGaAs or AlAs layer is oxidized using nitrogen and steam at a temperature of 420–450 degrees Celsius. However, the AlGaAs or AlAs layer undergoes a dimensional change after the oxidation. This dimensional change causes stresses in the current confinement area, as well as in the active area, which is in close proximity to the current confinement area. These stresses, as well as the method of fabricating the oxide confining layer for the VCSEL, are discussed in Choquette, supra.

Accordingly, it would be desirable to provide a VCSEL having a current confinement structure with advantages similar to those of the oxide confinement method, while at the same time avoiding the disadvantages of the material stresses caused by the oxide confinement method that may reduce the lifetime of the VCSEL device.

SUMMARY

According to a preferred embodiment, a VCSEL structure and fabrication method therefor are provided, wherein a subsurface air, gas, or vacuum current confinement method is used to restrict the area of electrical flow in the active region. Because air, gas, or vacuum is used, the stresses caused in oxidation-based current confinement methods are avoided. Additionally, because the confinement is achieved by subsurface cavity structures, overall mechanical strength of the current-confining region is maintained, such that possible "collapse" of the current-confining structure is not a problem.

According to a preferred embodiment, a vertical cavity structure is formed comprising a lower distributed Bragg reflector (DBR), an upper DBR, an active layer positioned between the lower DBR and the upper DBR, and a current confinement layer positioned adjacent to the active layer. The current confinement layer comprises a semiconductor material that is laterally etchable by a selective etchant to which the upper DBR material and active layer materials are etch-resistant. Three or more hollow vertical shafts are formed through the upper DBR layer and current confinement layer, the hollow vertical shafts being positioned outside a desired current confinement zone, the centers of the hollow vertical shafts forming a polygon that laterally circumscribes an area around the desired current confinement zone. The selective etchant is then applied, laterally etching away the current confinement layer outwardly from the axis of each hollow vertical shaft, forming a subsurface cavity around each hollow vertical shaft at the current confinement layer. The lateral etching process is continued until the subsurface cavities merge together to form a single subsurface circumferential cavity around the desired current confinement zone. Electrical current is confined to the current confinement zone as it passes through the current confinement layer. After optionally filling the subsurface circumferential cavity with an inert gas or other inert nonsolid material, the hollow vertical shafts are sealed off by a polyimide material, a gold plating material, and/or a dielectric material.

DESCRIPTION

According to one preferred embodiment, to overcome the limitations of the oxide-confinement method and the mesa-confinement method, a sub surface air aperture method is provided. Instead of oxidizing the layer near the active region (e.g., the AlGaAs layer) as in hole-defined oxidation (see Chua, C. L. et. al., "Planar laterally oxidized vertical-cavity lasers for low-threshold high-density top-surface-emitting arrays," IEEE Photonics Technology Letters, Vol. 9, No. 8, pp. 1060–2 (August 1997), which is incorporated by reference herein; see also Choquette, supra at p. 86), that layer is selectively etched away in a sub-surface etching process until only a vertical column, laterally circumscribed and isolated by an air cavity, remains at that layer beneath the surface of the wafer. Electrical current is therefore confined to the vertical column when passing from above that layer to below that layer.

The method of the preferred embodiments is in contrast to simply etching a mesa, as in earlier VCSEL fabrications (see Jewell, supra at p. 1338), where the process is highly nonplanar, resulting in manufacturing difficulty, and where the exposed mesa is difficult to passivate, resulting in degradation of the mesa due to oxidation of the AlGaAs layers and electrical degradations such as increases in leakage current. In a conventional mesa structure, due to non-uniform etching rates of the various layers, cantilever structures may result. Such cantilevered structures can collapse, resulting in a structure that is not desirable in the manufacturing of a reliable, reproducible VCSEL. See Deppe, supra at p. 89, where such a collapsed structure is shown.

Figure 1:
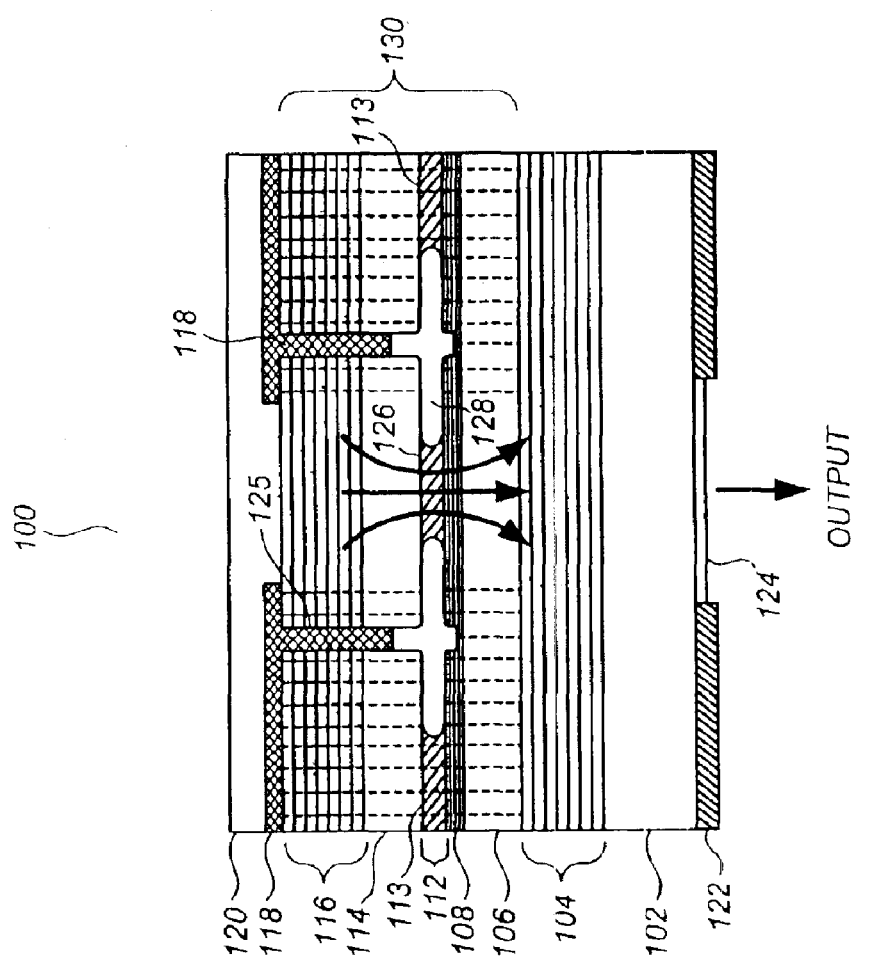
FIG. 1 illustrates a side view of a vertical cavity surface emitting laser (VCSEL) according to a preferred embodiment.

FIG. 1 illustrates a side view of a vertical cavity surface emitting laser (VCSEL) 100 according to a preferred embodiment. VCSEL 100 comprises a substrate 102, a lower DBR 104, an n-doped semiconductor layer 106, an active layer 108 such as a multi-quantum well (MQW) structure, a current confinement layer 112, a p-doped semiconductor layer 114, an upper DBR 116, an upper ohmic contact 120, a lower ohmic contact 122, and an antireflection-coated aperture 124. In the current confinement layer 112 is formed a subsurface circumferential cavity 128 that surrounds a current confinement zone 126. Current is confined to current confinement zone 126 as indicated by conceptual current arrows in FIG. 1. Outside the current confinement zone 126 an isolation region 130 is formed by proton implantation or ion implantation that prevents current from flowing around the outside of the subsurface circumferential cavity 128. Vertical shafts 125 used during the formation of the subsurface circumferential cavity 128 are, plugged with inert spacer material such as a dielectric material 118. As used herein, the term shaft is used to denote a hole (like a mine shaft) rather than to denote a solid member (like a drive shaft). Other materials may be used to seal the vertical shafts 125 such as polyamide material. Alternatively, the upper ohmic contact 120 may protrude somewhat into the vertical shafts 125 to seal them and therefore provide the sealing function. The subsurface circumferential cavity 128 is preferably sealed to contain an inert gas such as $N_2$, Ar, or He, but may alternatively contain regular air or other nonsolid material.

Figure 2:
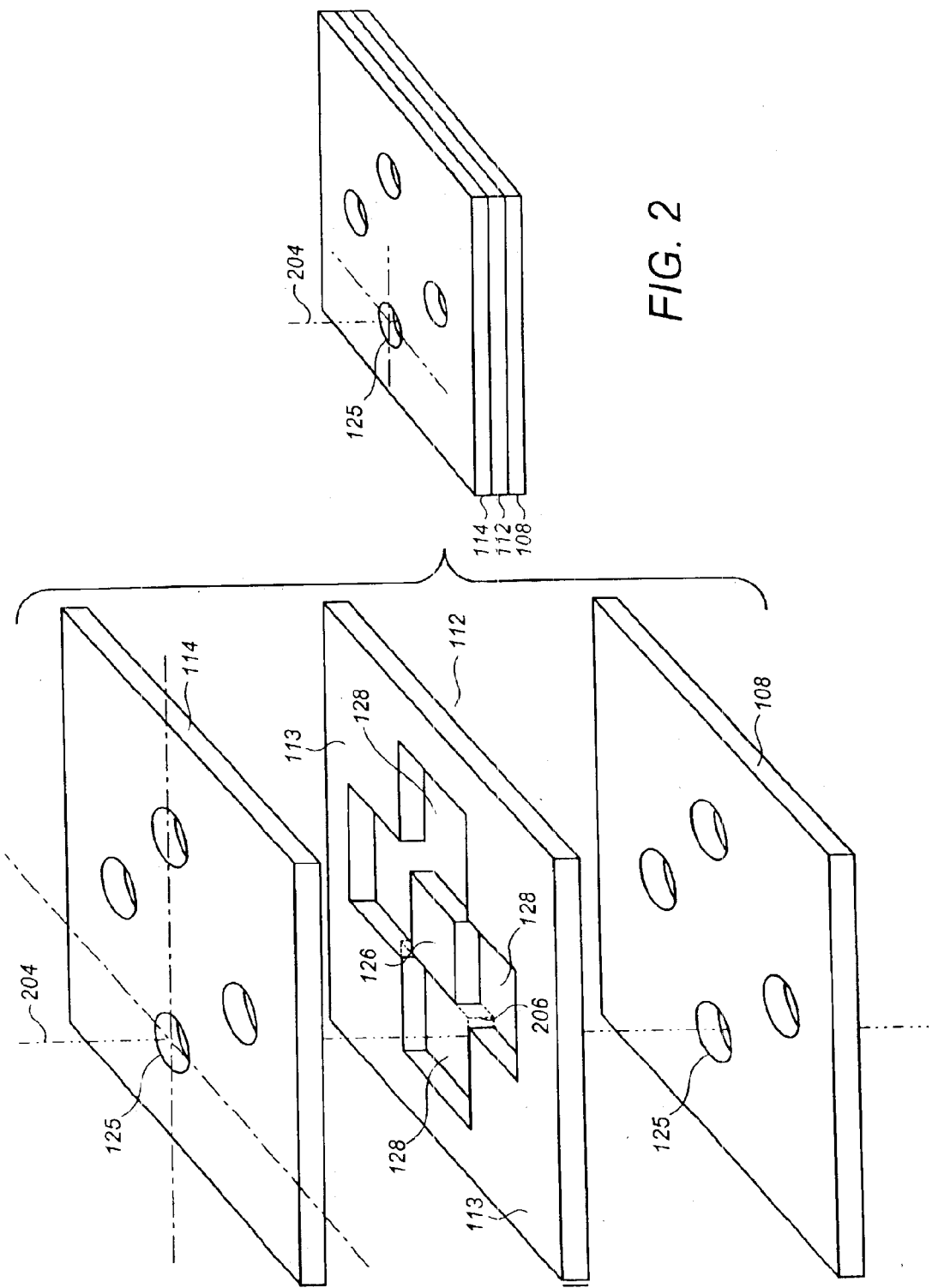
FIG. 2 illustrates an exploded perspective view of a current confinement structure according to a preferred embodiment.

FIG. 2 illustrates an exploded perspective view of the p-layer 114, the current confinement layer 112, and the active layer 108. In the embodiment shown there are four vertical shafts 125 spaced at the vertexes of a 4-sided polygon, the vertical shafts 125 laterally circumscribing the current confinement zone 126. In general, there may be any number M>2 of vertical shafts 125 placed at roughly regular angular spacings of 360/M degrees around a center of the current confinement zone 126, the centers of the vertical shafts being located at the vertices of an M-sided polygon. However, in order to ensure mechanical stability of the device, there should not be so many vertical shafts 125 so as to cause them to merge together into a single "canyon."

If the current confinement layer 112 is viewed in isolation, the current confinement zone 126 resembles a small "island" of semiconductor material surrounded by empty space that is the subsurface circumferential cavity 128. In the embodiment of FIG. 2, it is presumed that the lateral etching of the current confinement layer 112 is anisotropic (directional) in two perpendicular lattice directions. The current confinement zone 126 is a column of semiconductor material, often of a somewhat irregular lateral shape, that extends from the active layer 110 beneath the current confinement layer 112 to the p-doped semiconductor layer 116 above the current confinement layer 112. The section of current confinement layer 112 lying outside the subsurface circumferential cavity 128, herein termed an outer support element 113, provides a mechanical support for the upper layers to keep the shape and size of the subsurface circumferential cavity 128 intact. The outer support element 113 is ion-implanted, proton-implanted, or otherwise treated to be non-conducting, such that the current is restricted to the current confinement zone 126.

Figure 3:
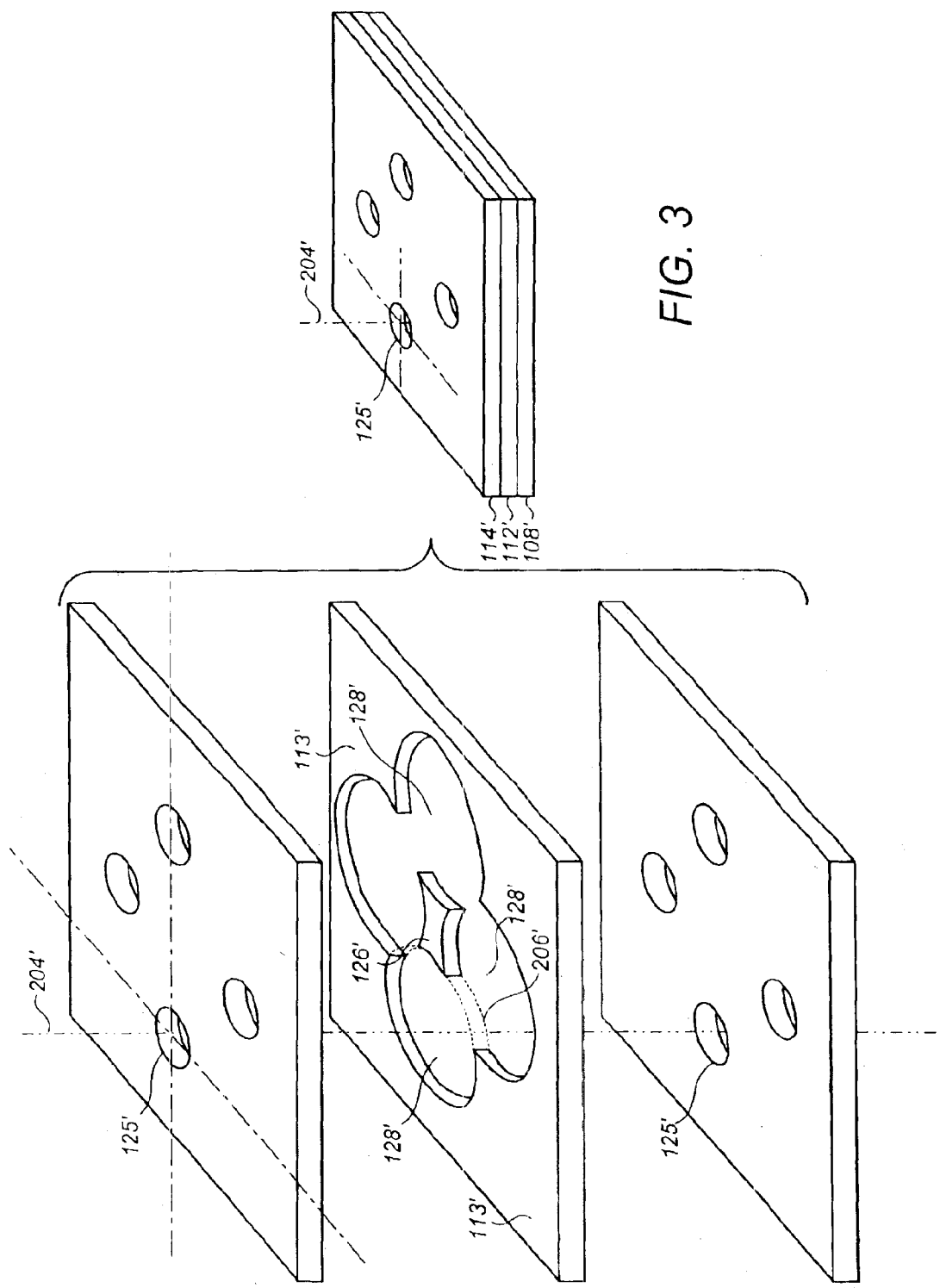
FIG. 3 illustrates an exploded perspective view of a current confinement structure according to a preferred embodiment.

FIG. 3 illustrates an exploded perspective view of a p-layer 114', a current confinement layer 112', and an active layer 108' in which the lateral etching process is isotropic (same in all directions). Roughly speaking, if all vertical shafts are equally placed around a circle of radius R2 centered on the current confinement zone 126', and if and the lateral etching process forms lateral etches into the current confinement layer of average radius R1 (see the outline of a subsurface cavity 206' outwardly etched from the axis 204'), the current confinement zone 126' will have an average radius of roughly R2–R1. As indicated in FIGS. 2–3, the current confinement zones 126 and 126' have a somewhat irregular geometric shape, but any sharp corers will likely be dulled by the etching process.

Figure 4:
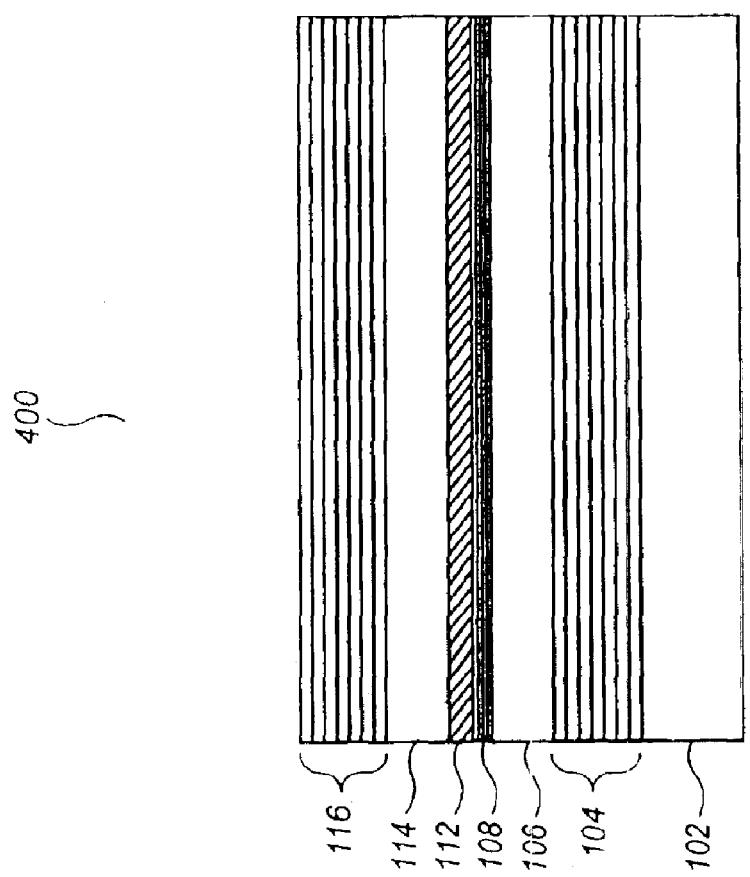
FIGS. 4–8 illustrate the VCSEL of FIG. 1 during different stages of the device fabrication process.
Figure 5:
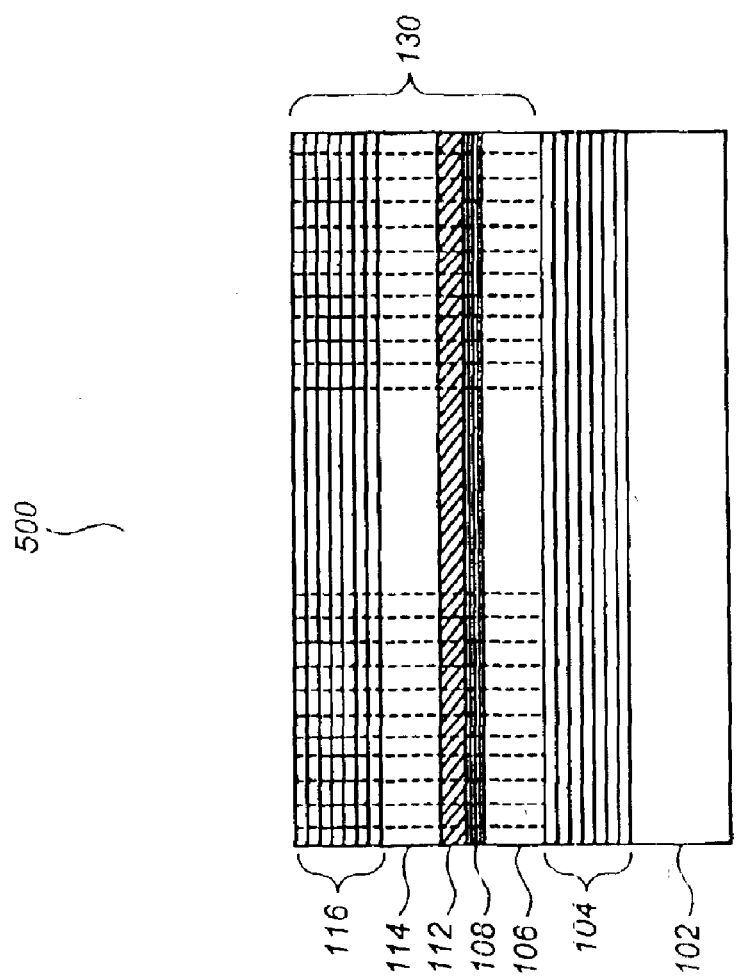

FIGS. 4–7 show views of structures corresponding to different points during a VCSEL fabrication process in accordance with a preferred embodiment. To fabricate a VCSEL in accordance with a preferred embodiment, the layers 102–116 are first generated using conventional methods through to the top DBR layer 116 (FIG. 4). FIG. 4 shows a simplified diagram of a vertical cavity structure prior to formation of the current confinement structure. Generally speaking, the current confinement layer 112 will be as close as possible to the active region 108 of the VCSEL, so that the current does not appreciably spread out after being confined and before passing through the active region 108. Thus, the layer beneath the current confinement layer will usually be an active region layer, although the scope of the preferred embodiments is not so limited. As shown in FIG. 5, the structure is ion-implanted to form the non-conductive implanted region 130, which is annularly disposed around a center axis of the device.

Figure 6:
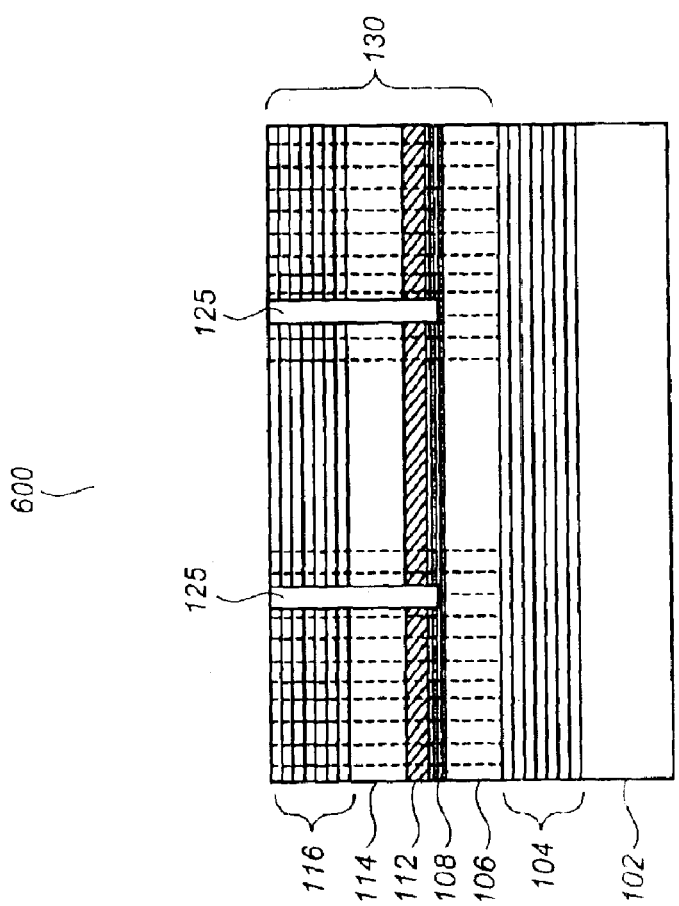
Figure 7:
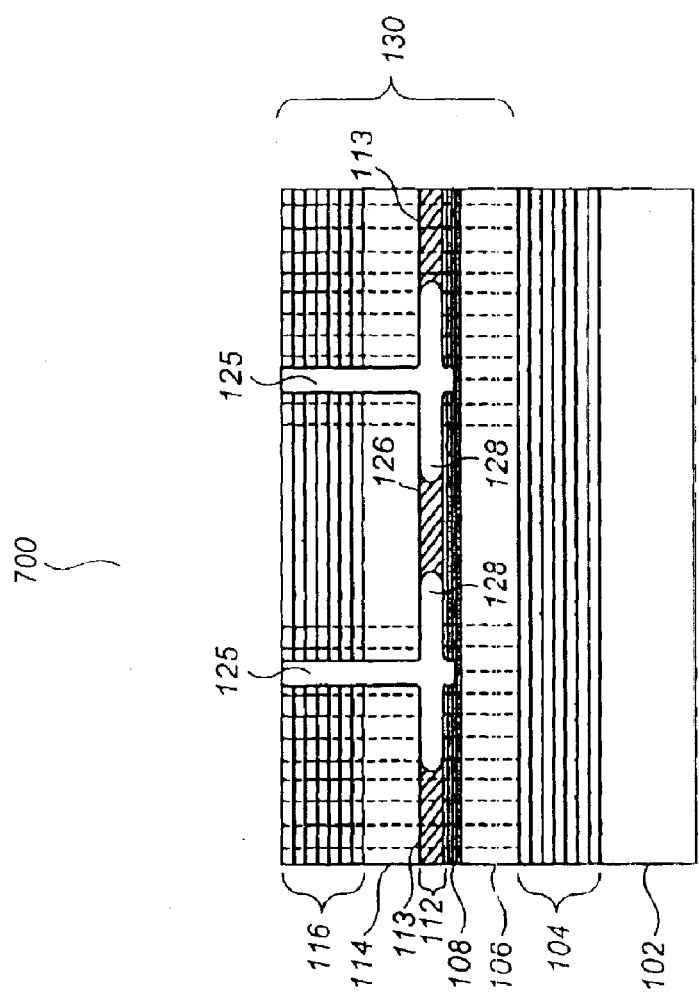

As shown in FIG. 6, hollow vertical shafts 125 are then patterned on the surface of the device beginning at the top DBR 116 and etched down until they reach at least the current confinement layer 112. As shown in FIG. 7, a selective etchant is then used to etch only the current confinement layer 112. The current confinement layer 112 is laterally etched away outwardly from the axis of each hollow vertical shaft 125, forming a subsurface cavity laterally around each hollow vertical shaft 125. The lateral etching process is continued until the subsurface cavities merge together to form a single subsurface circumferential cavity 128 around the desired current confinement zone 126.

Thus, the lateral etch proceeds until a desired amount of vertical column material remains to form the current confinement zone 126. The etches will usually be anisotropic along crystal directions of the layer etched, and therefore the etched regions are square or rectangular (or approximately so) when viewed from the top (FIG. 2). At a minimum the etch should proceed until a convergence or merging is reached, in which the air cavity etched from each hole merges into the air cavity etched from each neighboring hole to form the single subsurface circumferential cavity 128. FIG. 7 shows a side view of the sub-surface structure after the etch process.

In some respects, the VCSEL fabrication process of the preferred embodiments is similar to that described in Choquette, supra, i.e. a hole defined oxide-aperture method, except that an etching step is used instead of an oxidation step. Advantageously, however, the current-confining layer 112 can be made of any of a variety of materials, whereas the current-confining layer in the oxide-aperture method must be readily oxidizable (e.g., AlGaAs). In the oxide-aperture method, the oxidation process requires a high Al content in AlGaAs, or AlAs, which have higher barriers to the current (electron/hole) injection process. This will result in a higher voltage for the device and hence a lower wall plug efficiency. According to a preferred embodiment, a lower-bandgap material than AlGaAs may be selected for the current-confining layer 112, such as InGaAs (or related materials such as InGaAsP). The use of this lower-bandgap material results in a lower voltage across the current confining region and therefore less heating and higher wall plug efficiency. Because the current confinement zone 126 is on the "p" side of the active region 108 in the embodiment of FIG. 1, the current confinement layer should comprise a p-doped semiconductor material (e.g., p-InGaAs) or an undoped semiconductor material (e.g., i-InGaAs). The scope of the preferred embodiments is not so limited, however. In another preferred embodiment, the current confinement zone is on the "n" side of the active region, the current confinement layer comprising an n-doped semiconductor material or an undoped semiconductor material.

The material for the current-confining layer 112 should be selected such that it etches more quickly than the material above it in order for the sub-surface cavity structure to be properly formed, and to avoid undesired etching artifacts in the material above and below it. Because the respective layers are not "masked" along the vertical walls of the holes, it should be noted that the etching of current confinement layer 112 may also result in some etching of the upper DBR mirror 116 and the active layer 108. The current confinement layer 112 should be selected such that the etch rate for this layer is significantly (at least a factor of 2 faster) faster than the etch rate of the surrounding material. For example, an current confinement layer 112 composed of AlGaAs with Al mole fraction of 0.92 or greater, will result in etching of the current confinement layer 112 faster than the surrounding material using buffered HF. InGaAs with an In mole fraction of 0.01 to 0.2 may also be used as a current confinement layer 112. In cases where the active layer is composed of the same material as the current confinement layer 112, care must be taken in the positioning of the depth of the vertical shafts such that it does not penetrate the active layer. Etch stop layers can be used to prevent such penetration.

It is to be appreciated that the overall structure incorporating the subsurface cavity is mechanically stable and resistant to collapse, since it is not a cantilever structure as in the case of the mesa method of Deppe, supra. In addition, the overall wafer surface remains substantially planar which allows high-yield manufacturing.

Figure 8:
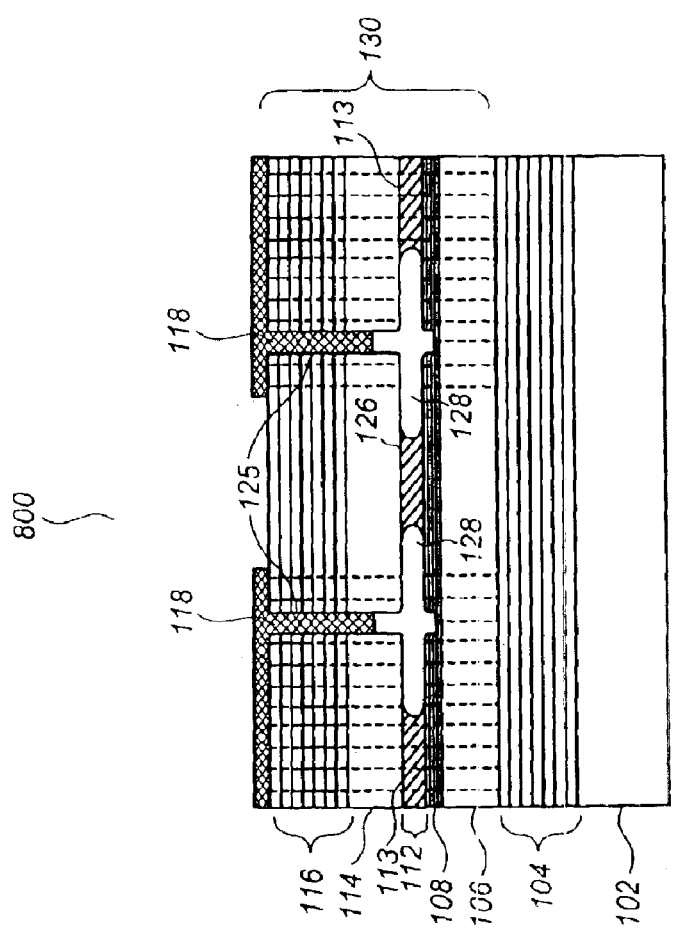

As shown in FIG. 8, to passivate the sub surface air aperture, the vertical shafts 125 used to access the current confinement layer can be sealed in a variety of manners, either gold plating to assist in heat removal, dielectric seals using plasma enhanced chemical vapor deposition (PECVD), or polymer seal using polyimide. In addition, one or more inert gases can be sealed inside the structure, such as $N_2$, Ar, or He, for enhanced passivation or assistance in heat removal.

As described supra, the resulting cavity formed by the etching process will be generally square or rectangular for an anisotropic etch, and generally circular or oblong for an isotropic, etch. More generally, however, the air aperture may generally be circular, rectangular, or of another shape depending on the type of holes, the number of holes used, and the etching type and conditions. Optionally, the regions around the sub-surface air aperture may be filled with an inert gas which may consist of $N_2$, Ar and/or He for hermeticity and to help thermal conduction. Proton ion implantation is used also for isolation 16 reduce parasitic capacitances and to prevent undesirable current injection patterns from the etched trenches that may be filled with a conducting material that may affect the mode pattern of the VCSEL.

In an optional preferred embodiment, multiple sub-surface air apertures may be used to achieve single spatial mode operation. Instead of etching only a single layer of material to form a single sub-surface cavity, a plurality of alternating layers of material may be etched to form several sub-surface cavities, in a manner that is perhaps analogous to a multi-level underground parking garage. Just as current confinement through multi-level oxidation may be advantageously used to suppress higher-order modes in the vertical laser cavity (see Nishiyama, N. et. al., "Multi-oxide layer structure for single-mode operation in vertical cavity surface emitting lasers," IEEE Photonics Technology Letters, Vol. 12, No. 6, pp. 606–8 (2000), which is incorporated by reference herein), it has been found that multi-level subsurface cavity structures may also be used to suppress higher-order modes in the vertical laser cavity, thereby enhancing single-mode operation.

Many other VCSEL configurations are within the scope of the preferred embodiments, e.g., a top dielectric DBR and a top emitting VCSEL structure. A bottom emitting structure is shown for the device of FIG. 1 because the active region is closer to the p-contact and heat can be removed efficiently from the VCSEL by bonding the p-contact to a heat sink. However, it is to be appreciated that a person skilled in the art would be readily able to adapt the methods and structures of the preferred embodiments to a top-emitting structure.

By way of further example, in the device of FIG. 1 the active region is "below" the subsurface circumferential cavity. However, it is to be appreciated that a person skilled in the art would be readily able to adapt the methods and structures of the preferred embodiments to a VCSEL In which the active region is "above" the subsurface circumferential cavity. It may be advantageous to have the active region "above" the subsurface circumferential cavity since then it is closer to the p-contact and the heat sink and has more material to help thermal conduction of the heat away from the junction toward the heat sink.

Whereas many alterations and modifications of the present invention will no doubt become apparent to a person of ordinary skill in the art after having read the foregoing description, it is to be understood that the particular embodiments shown and described by way of illustration are in no way intended to be considered limiting. By way of example, it is to be appreciated that a person skilled in the art would be readily able to adapt the methods and structures of the preferred embodiments to short-wavelength VCSELs, to VCSELs comprising any of a variety of different active region material systems, to VCSELs comprising any of a variety of different DBR materials, and in general to many different kinds of VCSELs. Therefore, reference to the details of the preferred embodiments are not intended to limit their scope, which is limited only by the scope of the claims set forth below.

What is claimed is:

1. In a vertical cavity surface emitting laser (VCSEL), comprising:

vertically stacked material layers including a first material layer positioned above a second material layer, an intermediate region being disposed therebetween, electrical current flowing between the first material layer and the second material layer through the intermediate region during operation of the VCSEL; and a current confinement structure for laterally restricting the flow of electrical current passing through the intermediate region, comprising:

a central column of semiconductor material vertically extending between the first and second material layers;

a subsurface cavity laterally circumscribing said central column of semiconductor material and vertically extending between the first and second material layers, said subsurface cavity being filled with a non-solid material or vacuum; and an outer support element laterally surrounding said subsurface cavity, said outer support element comprising a non-electrically-conducting material, said outer support element mechanically supporting said first and second material layers in conjunction with said central column of semiconductor material, the electrical current being laterally confined to said central column while passing from the first layer to the second layer.

2. The current confinement structure of claim 1, the VCSEL having a plurality of upper material layers positioned above said first material layer, further comprising at least three vertically etched shafts extending downward from a top surface of said upper material layers to said subsurface cavity.

3. The current confinement structure of claim 2, wherein said vertically etched shafts are plugged such that said subsurface cavity is sealed.

4. The current confinement structure of claim 3, wherein said non-solid material is air.

5. The current confinement structure of claim 3, wherein said non-solid material comprises an inert gas.

6. The current confinement structure of claim 3, wherein said vertically etched shafts are plugged with a polyamide sealer.

7. The current confinement structure of claim 2, said outer support element and said central column being formed from a common layer of semiconductor material, said outer support element being implanted so as to be non-electrically-conductive.

8. The current confinement structure of claim 7, said first material layer and said upper material layers being implanted in lateral regions thereof lying above said outer support element.

9. The current confinement structure of claim 8, the VCSEL having a plurality of lower material layers positioned below the second material layer, said second material layer being an active layer, wherein electrical current flowing through the second material layer to the lower material layers is substantially confined to a lateral area corresponding to a lateral extent of said central column of semiconductor material.

10. The current confinement structure of claim 8, said first material layer being an active layer, wherein electrical current flowing through the first material layer to the second material layers is substantially confined to a lateral area corresponding to a lateral extent of said central column.

11. The current confinement structure of claim 8, wherein said common layer of semiconductor material forming said central column and said outer support element comprises an oxidation-resistant, low-bandgap semiconductor material.

12. The current confinement structure of claim 11, said common layer of semiconductor material being InGaAs or InGaAsP.

13. The current confinement structure of claim 12, the VCSEL having a plurality of lower material layers positioned below the second material layer, said second material layer being an active layer, wherein said upper material layers comprise a distributed Bragg reflector (DBR), wherein said first material layer is a p-doped semiconductor layer, and wherein said lower material layers comprise a DBR.

14. A vertical cavity surface emitting laser (VCSEL) formed from a vertical stack of substantially flat material layers, comprising:

an active layer disposed between a first set of material layers thereabove and a second set of material layers therebelow, electrical current flowing between said first set and said second set of material layers during operation of the VCSEL; and a current confinement layer positioned substantially adjacent to said active layer, said current confinement layer being partitioned into a central current confinement zone comprising a semiconductor material and an outer support zone comprising an implanted semiconductor material, said central current confinement zone being separated from said outer support zone by a subsurface cavity laterally circumscribing said central current confinement zone, the electrical current flowing through said active layer only in a laterally extending area substantially corresponding to said current confinement zone of said current confinement layer; and at least three vertical etched shafts extending downward from a top surface of said first set of material layers to said subsurface cavity, wherein each of said first set of material layers remains laterally integral over said central current confinement zone, said subsurface cavity, and said outer support zone at locations other than said vertically etched shafts.

15. The VCSEL of claim 14, wherein said vertically etched shafts are plugged such that said subsurface cavity is sealed.

16. The VCSEL of claim 15, wherein said subsurface cavity is filled with air, vacuum, or an inert gas.

17. The VCSEL of claim 15, wherein said vertically etched shafts are plugged with a polyamide sealer.

18. The VCSEL of claim 14, wherein said semiconductor material of said current confinement layer is oxidation-resistant.

19. The VCSEL of claim 18, wherein said semiconductor material of said current confinement layer is a low-bandgap semiconductor material.

20. The VCSEL of claim 19, wherein said semiconductor material of said currents confinement layer is InGaAs or InGaAsP.

\* \* \* \* \*